United States Patent
Kris

(10) Patent No.: US 8,762,614 B2
(45) Date of Patent: Jun. 24, 2014

(54) ANALOG-TO-DIGITAL CONVERTER WITH EARLY INTERRUPT CAPABILITY

(75) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 382 days.

(21) Appl. No.: 13/309,664

(22) Filed: Dec. 2, 2011

(65) Prior Publication Data

US 2013/0145066 A1   Jun. 6, 2013

(51) Int. Cl.
G06F 13/24 (2006.01)
(52) U.S. Cl.
CPC ................................. *G06F 13/24* (2013.01)
USPC ........................................................ 710/260
(58) Field of Classification Search
CPC ....... G06F 13/24; G06F 13/26; G06F 13/385; G06F 13/423
USPC .......................... 710/260–269, 46–51, 60–61
See application file for complete search history.

(56) References Cited

U.S. PATENT DOCUMENTS 3,582,628 A * 6/1971 Brussolo ........................... 708/2
6,209,086 B1 * 3/2001 Chi et al. ...................... 712/244
8,558,582 B1 * 10/2013 Hsu .................................. 327/91
2006/0091828 A1 * 5/2006 Bruno ............................ 315/292
2009/0300249 A1 * 12/2009 Moyer et al. .................. 710/260

OTHER PUBLICATIONS

Kim, Jin-Cheon et al., "A Mixed-Mode Single-Chip Motor-Drive-Specific Microcontroller with a 12-Bit 125 KS/s ADC," ASIC/SOC Conference, Proceedings of the 13th Annual IEEE International Conference, 5 pages, Sep. 2000.
Pasquali, G. et al., "A DSP Equipped Digitizer for Online Analysis of Nuclear Detector Signals," Nuclear Instruments & Methods in Physics Research, vol. 570, No. 1, Elsevier, 7 pages, Nov. 3, 2006.
International Search Report and Written Opinion, Application No. PCT/US2012/067221, 12 pages, Jun. 17, 2013.

* cited by examiner

*Primary Examiner* — Raymond Phan
(74) *Attorney, Agent, or Firm* — King & Spalding L.L.P.

(57) ABSTRACT

An early interrupt feature enables generation of interrupts prior to completion of an analog-to-digital conversion to be used in a processor PID calculation. Even though an analog-to-digital conversion is still in process, the PID application software can use the early interrupt time to begin execution of an interrupt service routine (ISR). The early interrupt can improve the throughput and response time of the PID control loop by overlapping the completion of the ADC conversion with the processor overhead associated with the interrupt request. A plurality of pipelined registers, each having substantially the same delay time as the pipelined stages of the ADC, are selectable to provided a delay time that may be used to generate an early interrupt, wherein the latency time between an ADC conversion and processing of an interrupt relating to that ADC conversion may thereby be shortened.

12 Claims, 3 Drawing Sheets

ANALOG-TO-DIGITAL CONVERTER WITH EARLY INTERRUPT CAPABILITY

TECHNICAL FIELD

The present disclosure relates to mixed signal integrated circuit devices, and more particularly, to integrated circuit devices used in control systems having critical timing requirements.

BACKGROUND

Control system stability is very dependent upon and is affected by delays in the control loop due to analog-to-digital signal conversion and information transfer delay times. For example, in a pulse width modulation (PWM) controlled system the control loop stability is highly dependent upon the delays from the moment the analog data value is sampled until an updated PWM output can be applied to the controlled circuit. Typical techniques to reduce control loop delays are to use faster digital processors and faster analog-to-digital converters (ADCs) to reduce the time needed to acquire feed back information and then compute the next control output state. Faster digital processors and ADCs are more expensive and consume more power than the more common low power processors and ADCs. Excessive loop delays can introduce overshoot and instability in the control loop performance, and is not desirable in high performance electronic control devices and systems.

SUMMARY

Therefore, there is a need to reduce delay times in a control loop having digital components without substantially increasing the cost and power requirements of the active components used in the control loop application.

According to an embodiment, an apparatus for analog-to-digital conversion with early interrupt capability may comprise: a digital processor and a memory coupled to the digital processor; an interrupt controller coupled to the digital processor, wherein the interrupt controller is adapted to handle interrupts to the digital processor based upon information from a selected analog channel; an analog-to-digital converter (ADC) having a plurality of pipelined stages for converting a sampled analog signal from the selected analog channel to a digital representation thereof; a plurality of pipelined registers arranged to transfer the information from the selected analog channel from one register to a next register at each clock pulse thereto, wherein transfer time through each of the plurality of pipelined registers is substantially the same as delay time through each of the plurality of pipelined stages of the ADC; and a circuit for selecting a one of the plurality of pipelined registers, wherein a conversion ready delay time of the information from the selected analog channel is equal to the delay time at the selected one of the plurality of pipelined registers, whereby the information from the selected analog channel is available to the interrupt controller after the conversion ready delay time.

According to a further embodiment, the conversion ready delay time is less than or equal to an interrupt handling request time from the interrupt controller to the digital processor. According to a further embodiment, the information about the selected analog channel comprises a channel number and a sample ready. According to a further embodiment, a time the ADC takes to convert the sampled analog signal to the digital representation thereof is less than or equal to the interrupt handling request time. According to a further embodiment, the circuit for selecting the one of the plurality of pipelined registers may comprise: a first multiplexer having respective inputs coupled to a portion of each of the plurality of pipelined registers containing the channel number; a second multiplexer having respective inputs coupled to another portion of each of the plurality of pipelined registers containing the sample ready; and a binary to one line decoder, wherein the digital processor is coupled to the first and second multiplexers and selects which inputs thereof are coupled to outputs thereof, the outputs thereof are coupled to inputs of the binary to one line decoder, whereby the binary to one line decoder converts the channel address, when the sample ready is asserted, to a respective single ready line output coupled to the interrupt controller, thereby initiating a respective interrupt to the digital processor. According to a further embodiment, the circuit for selecting the one of the plurality of pipelined registers may comprise: a first multiplexer having respective inputs coupled to a portion of each of the plurality of pipelined registers containing the channel number; a second multiplexer having respective inputs coupled to another portion of each of the plurality of pipelined registers containing the sample ready; and a binary to one line decoder, wherein the digital processor is coupled to the first and second multiplexers and independently selects which input of the first multiplexer is coupled to an output thereof, and which input of the second multiplexer is coupled to an output thereof, the outputs of the first and second multiplexers are coupled to inputs of the binary to one line decoder, whereby the binary to one line decoder converts the channel address, when the sample ready is asserted, to a respective single ready line output coupled to the interrupt controller, thereby initiating a respective interrupt to the digital processor. According to a further embodiment, the digital processor is a microcontroller. According to a further embodiment, the digital processor is selected from the group consisting of a microprocessor, a digital signal processor (DSP), a programmable logic array (PLA) and an application specific integrated circuit (ASIC). According to a further embodiment, the digital processor, the interrupt controller, the ADC, the plurality of pipelined registers and the circuit for selecting ones of the plurality of pipelined registers are fabricated on an integrated circuit die.

According to another embodiment, a method for providing an early interrupt during an analog-to-digital conversion may comprise the steps of: providing a digital processor and a memory coupled to the digital processor; providing an interrupt controller coupled to the digital processor, wherein the interrupt controller is adapted to handle interrupts to the digital processor based upon information about a selected analog channel; providing an analog-to-digital converter (ADC) having a plurality of pipelined stages for converting a sampled analog signal from the selected analog channel to a digital representation thereof; providing a plurality of pipelined registers arranged to transfer the information about the selected analog channel from one register to a next register at each clock pulse thereto, wherein transfer time through each of the plurality of pipelined registers is substantially the same as delay time through each of the plurality of pipelined stages of the ADC; and selecting a one of the plurality of pipelined registers, wherein a conversion ready delay time of the information about the selected analog channel is equal to the delay time through the selected one of the plurality of pipelined registers, whereby the information about the selected analog channel is available to the interrupt controller after the conversion ready delay time.

According to yet another embodiment, a system having a digital closed loop control for regulating an output voltage may comprise: a digital processor and a memory coupled to the digital processor, the digital processor having a software program that calculates a loop control signal from a reference value and a feedback value; a pulse width modulation (PWM) generator having an input coupled to an output of the digital processor that supplies the loop control signal; a power switch having an input coupled to and controlled by the PWM generator; a filter network comprising an inductor and a capacitor, wherein the filter network is coupled to an output of the power switch and produces a direct current (DC) voltage based upon operation of the power switch controlled by the PWM generator; a sample and hold circuit having an analog input coupled to the DC voltage from the output of the filter network, wherein the sample and hold circuit takes a sample of the DC voltage and holds the DC voltage sample; an analog-to-digital converter (ADC) having a plurality of pipelined stages for converting the DC voltage sample to a digital representation thereof, wherein the digital representation of the DC voltage sample is used as the feedback value read by the digital processor; a plurality of pipelined registers arranged to transfer information from the sample and hold circuit from one register to a next register at each clock pulse thereto, wherein transfer time through each of the plurality of pipelined registers is substantially the same as delay time through each of the plurality of pipelined stages of the ADC; an interrupt controller coupled to the digital processor, the interrupt controller is adapted to handle interrupts to the digital processor based upon the information from the sample and hold circuit; and a circuit for selecting a one of the plurality of pipelined registers, wherein a conversion ready delay time of the information from the sample and hold circuit is equal to the delay time through the selected ones of the plurality of pipelined registers, whereby the information from the sample and hold circuit is available to the interrupt controller after the conversion ready delay time. According to a further embodiment, the sample and hold circuit may comprise a plurality of analog input channels, and the information from the sample and hold circuit may comprise a channel number of an active one of the plurality of analog input channels and an analog ready signal for the active one of the plurality of analog input channels.

BRIEF DESCRIPTION OF THE DRAWINGS

A more complete understanding of the present disclosure may be acquired by referring to the following description taken in conjunction with the accompanying drawings wherein.

Figure 1:
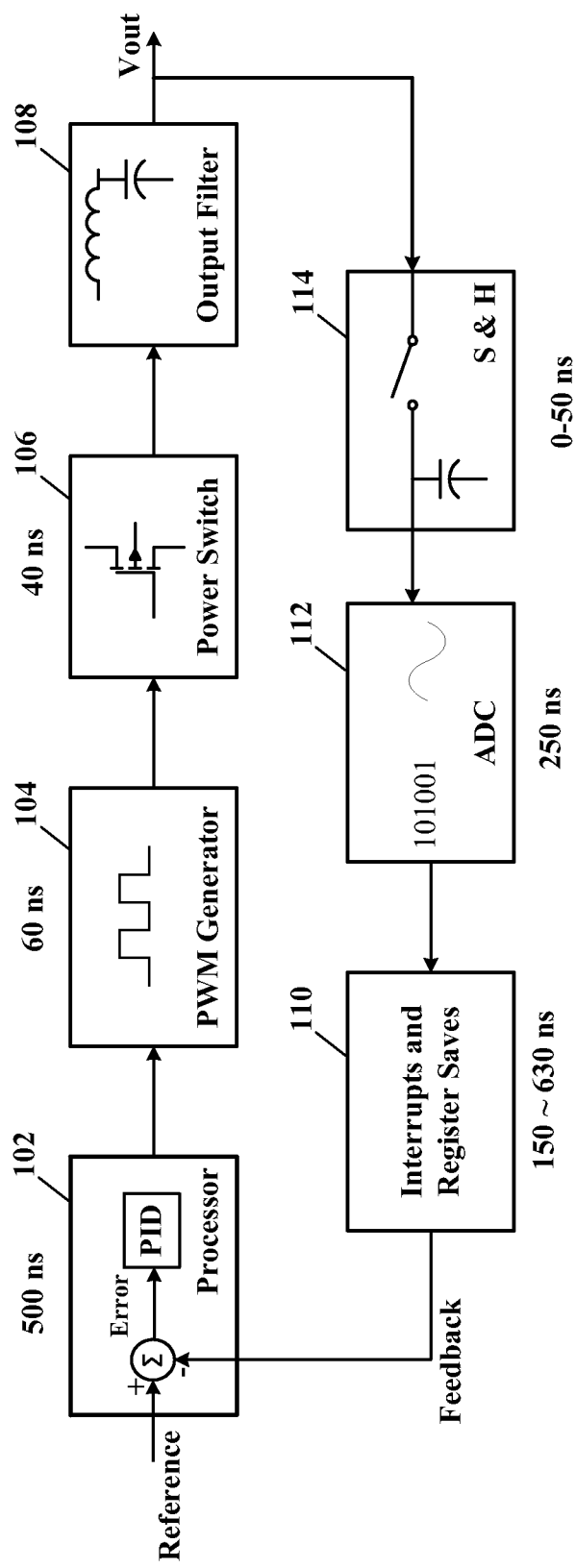
FIG. 1 illustrates a schematic block diagram of a typical digital closed loop control system and possible delay times for each function of the closed loop control system.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

To reduce delay times in a control loop having digital components without substantially increasing the cost and power requirements of the active components used in the control loop application, an "early interrupt," e.g., "anticipation" or "head start time," feature generates interrupts prior to completion of an analog-to-digital conversion. Even though an analog input is still in the analog-to-digital conversion process, the processor (PID) application software can use the "head start" time to begin execution of an entry into an interrupt service routine (ISR). The early interrupt can improve the throughput and response time of the control loop by overlapping the completion of the ADC conversion with the processor overhead associated with the interrupt request. A plurality of pipelined registers, each having substantially the same delay time as the pipelined stages of the ADC, are selectable to provided a delay time that may be used to generate an early interrupt, wherein the latency time between an ADC conversion and processing of an interrupt relating to that ADC conversion may thereby be shortened.

Referring now to the drawing, the details of a specific example embodiment is schematically illustrated. Like elements in the drawings will be represented by like numbers, and similar elements will be represented by like numbers with a different lower case letter suffix.

Referring to FIG. 1, depicted is a schematic block diagram of a typical digital closed loop control system and possible delay times for each function of the closed loop control system. A digital processor 102 performs a proportional-integral-derivative (PID) control function in software. The PID control function is a generic control loop feedback mechanism (controller) widely used in industrial control systems—a PID control function is the most commonly used control in a feedback control loop. The PID control function calculates an "error" value as the difference between a measured process variable (feedback) and a desired set point (reference). The PID control function attempts to minimize this error by adjusting the process control signal, e.g., control signal from the pulse width modulation (PWM) generator 104. The PWM generator 104 controls a power switch 106 that drives a switching regulator filter network 108 which produces a voltage output, Vout, from which the process variable is measured. A sample and hold circuit 114 takes a sample of the process variable voltage output, Vout, and holds that voltage sample until an analog-to-digital converter (ADC) 112 can convert the sampled analog voltage to a digital value. Once this process variable digital value is available, it is presented to the digital processor 102 by doing an interrupt request by the interrupt controller 110 to the digital processor 102. An integrated circuit mixed signal device such as, for example but not limited to, a microcontroller may function as the digital processor (and program memory) 102, the PWM generator 104, the sample and hold circuit 114, the ADC 112 and/or the interrupt controller 110, or any combination thereof. The digital processor may be, for example but is not limited to, a microprocessor, a digital signal processor (DSP), a programmable logic array (PLA), an application specific integrated circuit (ASIC), etc.

Typical latency times for each function block of the digital closed loop control system shown in FIG. 1 may be for example 500 nanoseconds (ns) for the digital processor 102 to calculate a PID solution derived from comparison between the reference (digital value) and the feedback digital value from the digital output of the ADC 112. The PWM generator 104 may have a 60 ns update delay. The power switch 106 may have up to a 40 ns switching delay. The sample and hold circuit 114 may require 50 ns delay if not a tracking sample and hold which may have no inherent delay. The ADC 112 may have an analog voltage sample conversion latency of about 250 ns, depending upon the number of pipe stages. And the interrupt controller 110 may require from about 150 ns to about 630 ns of software and hardware delays. These delay time values are deterministic and depend upon the closed loop system hardware design and software programming. Each design would have to determine the actual delay values inherent in operation thereof.

Significantly, the interrupt processing time (e.g., 150 to 630 ns delay) for an interrupt to the digital processor and memory 102, e.g., microcontroller, that performs the software calculations for the PID control function can exceed the time required to convert the analog signal sample into a digital value (e.g., 250 ns delay). This interrupt delay includes the time for the hardware logic to respond to the interrupt, and the time spent saving data in registers, getting register pointers, etc., prior to actually processing the digital value from the ADC 112 for calculating the PID control function result in the digital processor 102.

Figure 2:
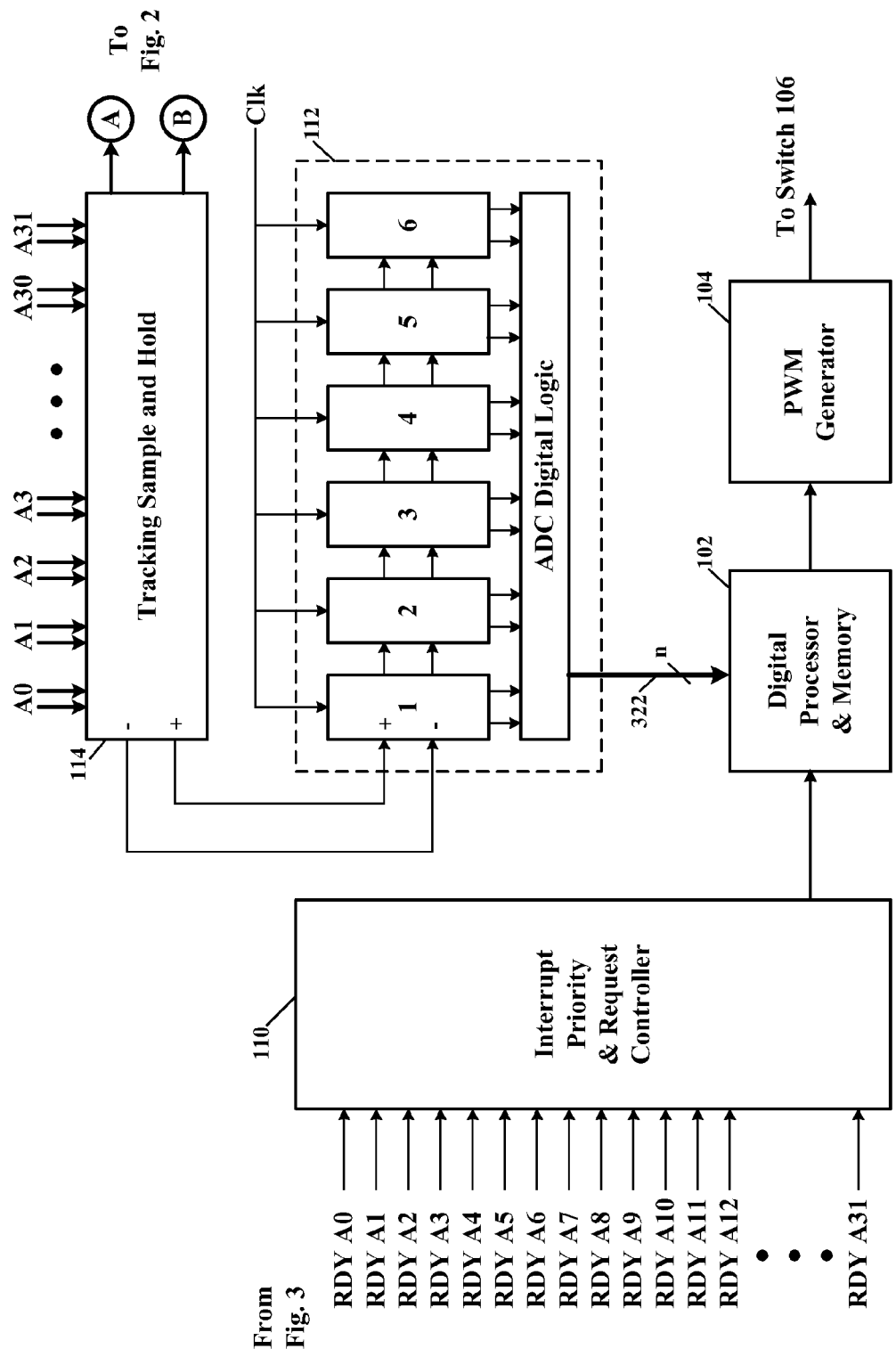
FIG. 2 illustrates a schematic block diagram of a pipelined analog-to-digital converter (ADC), a digital processor performing the PID control, an interrupt controller and a pulse width modulation (PWM) generator as shown in FIG. 1.

Referring to FIG. 2, depicted is a schematic block diagram of a pipelined analog-to-digital converter (ADC), a digital processor performing the PID control, an interrupt controller and a pulse width modulation (PWM) generator as shown in FIG. 1. The ADC 112 shown is a pipelined ADC such as, for example but is not limited to, a Cambridge Analog Technologies, Inc., model CAT-ADP12B24M-5SH-T180CEF. All information publicly available for pipelined ADC designs are incorporated by reference herein for all purposes. A six stage pipelined ADC 112 is shown in FIG. 2. For exemplary descriptive purposes a 50 ns delay for each ADC pipeline stage will be assumed. Therefore according to this example and the six stage pipelined ADC 112 shown in FIG. 2, a complete analog-to-digital conversion will take place in six clock pulses, or 6×50 ns=300 ns. It is contemplated and within the scope of this disclosure that any number of pipelined ADC stages may be used in the ADC 112, according to the teachings of this disclosure.

A tracking sample and hold circuit 114 is shown in FIG. 2 having 32 analog differential inputs and an analog differential output coupled to the differential input of the ADC 112. The purpose of this tracking sample and hold circuit 114 is to capture (sample) any of the analog inputs thereto and store the sample(s) until the ADC 112 can convert each analog (e.g., voltage or current) sample to a digital value representative of the analog value (e.g., voltage value). A signal at node A indicates an active analog input and an address at node B represents the analog channel number associated with that active analog input.

The interrupt priority and request controller 110 receives interrupt requests, RDY Ax, as more fully explained hereinafter, processes them and causes the processor 102 to act upon the interrupt request(s) by reading the output of the ADC 112 containing the digital representation of the sampled analog value on data bus 322 that was just converted by the ADC 112.

Figure 3:
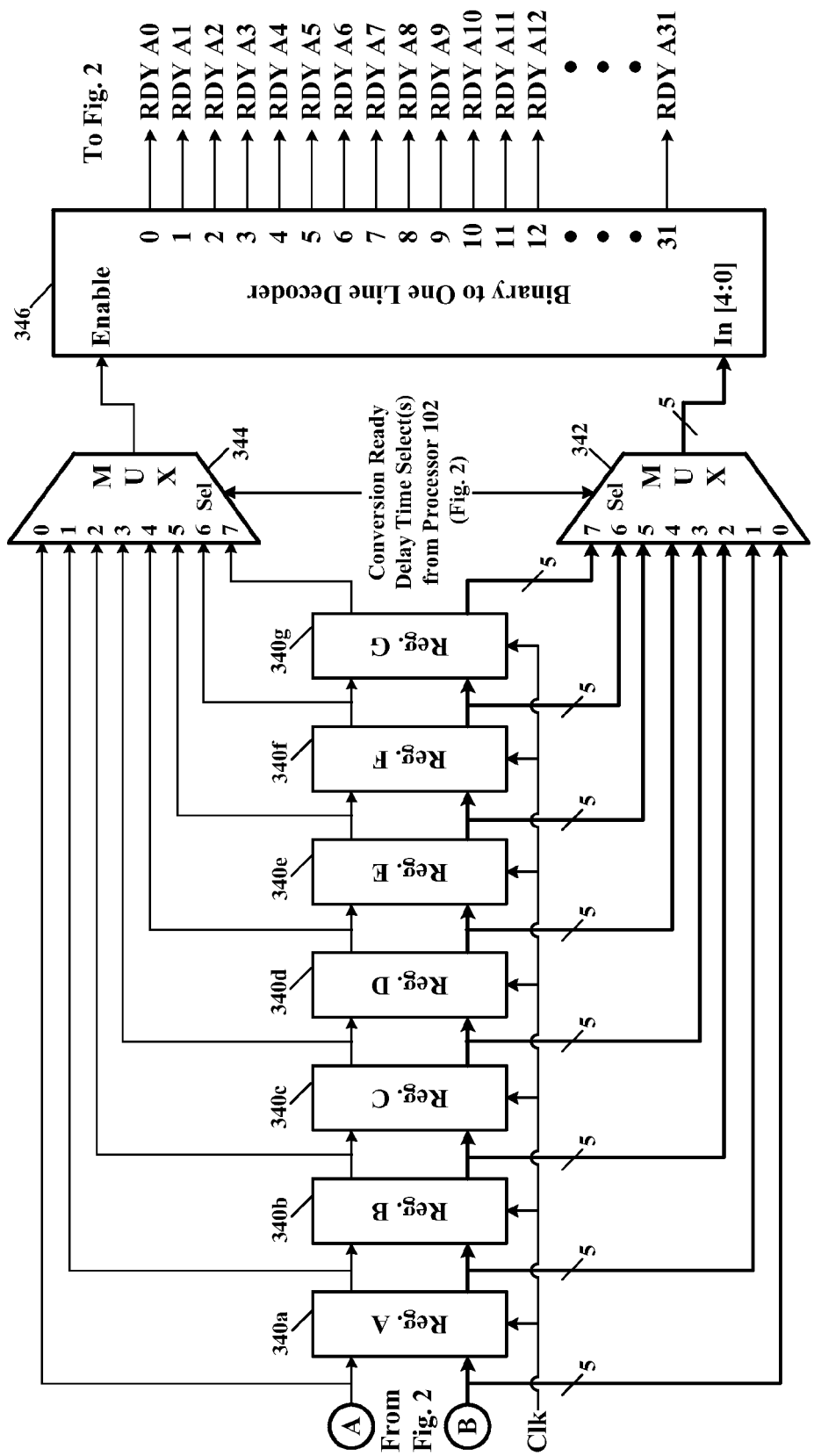
FIG. 3 illustrates a schematic block diagram of pipelined registers that track the pipelined operation of the ADC and delay time selection logic, according to a specific example embodiment of this disclosure.

Referring to FIG. 3, depicted is a schematic block diagram of pipelined registers that track the pipelined operation of the ADC and delay time selection logic, according to a specific example embodiment of this disclosure. The pipelined registers 340 correspond to the pipelined structure of the ADC 112 shown in FIG. 2, wherein each register 340 has substantially the same delay time as a pipelined stage of the ADC 112. A first multiplexer 342 has respective inputs coupled to the B node inputs (sampled analog channel address) of each of the registers 340 and to the B node output of register 340*g*. A second multiplexer 344 has respective inputs coupled to the A node inputs (active sampled analog input) of each of the registers 340 and to the A node output of register 340*g*. The outputs of the first and second multiplexers 342 and 344 are coupled to a binary to one line decoder 364, wherein the channel address from the first multiplexer 342, In [4:0], determines which one of the interrupt lines, RDY Ax, is asserted when the enable signal from the output of the second multiplexer 344 asserts an "Enable" signal representing that the ADC 112 sample is valid.

There are seven (7) pipelined registers 340 shown in FIG. 3, each having a 50 ns delay time therethrough upon each clock pulse (substantially matches delay of each clocked pipelined stage of the ADC 112). These seven (7) pipelined registers 340 provide up to 350 ns of delay time that is selectable from 0 ns to 350 ns in 50 ns steps. The first and second multiplexers 342 and 344 are used to select an appropriate conversion ready delay time that will effectively allow a "look-ahead" interrupt to be generated to the digital processor 102 before the actual analog-to-digital conversion from the ADC 112 has completed. For example, if it takes 150 ns to process an interrupt request through the interrupt priority and request controller 110 so that the processor 102 is ready to read the output of the ADC 112 on the data bus 322. If the ADC 112 takes 300 ns to process the analog to digital conversion, then by setting the first and second multiplexers 342 and 344 to produce a 150 ns conversion ready delay time (input 3 selected), the processor 102 will be ready to read the output of the ADC 112 as soon as the conversion therefrom has completed (150 ns conversion ready delay time+150 ns interrupt delay=300 ns conversion time of the ADC 112).

Another example is a worst case interrupt delay time of greater than 300 ns, e.g., 350 ns. For this situation, processing of an interrupt by the interrupt priority and request controller 110 should start as soon as the analog channel information is available at node B. This may be accomplished by setting the first and second multiplexers 342 and 344 to produce a 0 ns conversion ready delay time (input 0 selected), the processor 102 will be ready to read the output of the ADC 112 in 350 ns, but the ADC 112 conversion time is only 300 ns so there will be a 50 ns latency time between when the ADC 112 conversion is available to the processor 102 and when the processor 102 can read the digital information from the ADC 112. Generally whenever the interrupt request time is longer than the analog-to-digital conversion time, the conversion ready delay time should be selected as 0 ns. All delay times are deterministic and must be accounted for in the PID operating software, e.g., interrupt time and analog-to-digital conversion time, in determining an appropriate conversion ready delay time criteria.

The conversion ready delay time selection provided to the first and the second multiplexers 342 and 344, respectively, may be independently controlled from the processor 102. For example using a conversion ready delay time of 150 ns for the analog channel number (node B) and 200 ns delay for the analog conversion complete signal (enable) (node A) allows a 50 ns settling time for the analog channel number before the enable signal activates the binary to one line decoder 346 which will initiate an interrupt request to the processor 102 through the interrupt controller 110. For this example multiplexer 342 will be set to the third input (3) resulting in a 150 ns delay through the registers 340*a*, 340*b* and 340*c*, and multiplexer 344 will be set to input four (4) resulting in a 200 ns delay through registers 340*a*, 340*b*, 340*c* and 340*d*. Thus the analog channel number, In [4:0], will be available and stable 50 ns before the enable signal is received at the binary to one line decoder 346.

It is contemplated and within the scope of this disclosure that any number of pipelined registers 340 may be used with any number of pipelined ADC stages to accomplish a reduction of read latency time, according to the teachings of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for analog-to-digital conversion with early interrupt capability, comprising:
    a digital processor and a memory coupled to the digital processor;
    an interrupt controller coupled to the digital processor, wherein the interrupt controller is adapted to handle interrupts to the digital processor based upon information from a selected analog channel;
    an analog-to-digital converter (ADC) having a plurality of pipelined stages for converting a sampled analog signal from the selected analog channel to a digital representation thereof;
    a plurality of pipelined registers arranged to transfer the information from the selected analog channel from one register to a next register at each clock pulse thereto, wherein transfer time through each of the plurality of pipelined registers is substantially the same as delay time through each of the plurality of pipelined stages of the ADC; and
    a circuit for selecting a one of the plurality of pipelined registers, wherein a conversion ready delay time of the information from the selected analog channel is equal to the delay time at the selected one of the plurality of pipelined registers, whereby the information from the selected analog channel is available to the interrupt controller after the conversion ready delay time.

2. The apparatus according to claim 1, wherein the conversion ready delay time is less than or equal to an interrupt handling request time from the interrupt controller to the digital processor.

3. The apparatus according to claim 1, wherein the information about the selected analog channel comprises a channel number and a sample ready.

4. The apparatus according to claim 1, wherein the digital processor is a microcontroller.

5. The integrated circuit device according to claim 1, wherein the digital processor is selected from the group consisting of a microprocessor, a digital signal processor (DSP), a programmable logic array (PLA) and an application specific integrated circuit (ASIC).

6. The integrated circuit device according to claim 1, wherein the digital processor, the interrupt controller, the ADC, the plurality of pipelined registers and the circuit for selecting ones of the plurality of pipelined registers are fabricated on an integrated circuit die.

7. The apparatus according to claim 2, wherein a time the ADC takes to convert the sampled analog signal to the digital representation thereof is less than or equal to the interrupt handling request time.

8. The apparatus according to claim 3, wherein the circuit for selecting the one of the plurality of pipelined registers comprises:
    a first multiplexer having respective inputs coupled to a portion of each of the plurality of pipelined registers containing the channel number;
    a second multiplexer having respective inputs coupled to another portion of each of the plurality of pipelined registers containing the sample ready; and
    a binary to one line decoder,
    wherein the digital processor is coupled to the first and second multiplexers and selects which inputs thereof are coupled to outputs thereof, the outputs thereof are coupled to inputs of the binary to one line decoder, whereby the binary to one line decoder converts the channel address, when the sample ready is asserted, to a respective single ready line output coupled to the interrupt controller, thereby initiating a respective interrupt to the digital processor.

9. The apparatus according to claim 3, wherein the circuit for selecting the one of the plurality of pipelined registers comprises:
    a first multiplexer having respective inputs coupled to a portion of each of the plurality of pipelined registers containing the channel number;
    a second multiplexer having respective inputs coupled to another portion of each of the plurality of pipelined registers containing the sample ready; and
    a binary to one line decoder,
    wherein the digital processor is coupled to the first and second multiplexers and independently selects which input of the first multiplexer is coupled to an output thereof, and which input of the second multiplexer is coupled to an output thereof, the outputs of the first and second multiplexers are coupled to inputs of the binary to one line decoder, whereby the binary to one line decoder converts the channel address, when the sample ready is asserted, to a respective single ready line output coupled to the interrupt controller, thereby initiating a respective interrupt to the digital processor.

10. A method for providing an early interrupt during an analog-to-digital conversion, said method comprising the steps of:
    providing a digital processor and a memory coupled to the digital processor;
    providing an interrupt controller coupled to the digital processor, wherein the interrupt controller is adapted to handle interrupts to the digital processor based upon information about a selected analog channel;
    providing an analog-to-digital converter (ADC) having a plurality of pipelined stages for converting a sampled analog signal from the selected analog channel to a digital representation thereof;
    providing a plurality of pipelined registers arranged to transfer the information about the selected analog channel from one register to a next register at each clock pulse thereto, wherein transfer time through each of the plurality of pipelined registers is substantially the same as delay time through each of the plurality of pipelined stages of the ADC; and
    selecting a one of the plurality of pipelined registers, wherein a conversion ready delay time of the information about the selected analog channel is equal to the delay time through the selected one of the plurality of pipelined registers, whereby the information about the selected analog channel is available to the interrupt controller after the conversion ready delay time.

11. A system having a digital closed loop control for regulating an output voltage, said system comprising:
- a digital processor and a memory coupled to the digital processor, the digital processor having a software program that calculates a loop control signal from a reference value and a feedback value;
- a pulse width modulation (PWM) generator having an input coupled to an output of the digital processor that supplies the loop control signal;
- a power switch having an input coupled to and controlled by the PWM generator;
- a filter network comprising an inductor and a capacitor, wherein the filter network is coupled to an output of the power switch and produces a direct current (DC) voltage based upon operation of the power switch controlled by the PWM generator;
- a sample and hold circuit having an analog input coupled to the DC voltage from the output of the filter network, wherein the sample and hold circuit takes a sample of the DC voltage and holds the DC voltage sample;
- an analog-to-digital converter (ADC) having a plurality of pipelined stages for converting the DC voltage sample to a digital representation thereof, wherein the digital representation of the DC voltage sample is used as the feedback value read by the digital processor;
- a plurality of pipelined registers arranged to transfer information from the sample and hold circuit from one register to a next register at each clock pulse thereto, wherein transfer time through each of the plurality of pipelined registers is substantially the same as delay time through each of the plurality of pipelined stages of the ADC;
- an interrupt controller coupled to the digital processor, the interrupt controller is adapted to handle interrupts to the digital processor based upon the information from the sample and hold circuit; and
- a circuit for selecting a one of the plurality of pipelined registers, wherein a conversion ready delay time of the information from the sample and hold circuit is equal to the delay time through the selected ones of the plurality of pipelined registers, whereby the information from the sample and hold circuit is available to the interrupt controller after the conversion ready delay time.

12. The system according to claim 11, wherein the sample and hold circuit further comprises a plurality of analog input channels, and the information from the sample and hold circuit comprises a channel number of an active one of the plurality of analog input channels and an analog ready signal for the active one of the plurality of analog input channels.

* * * * *